United States Patent [19]
Takeuchi

[11] Patent Number: 6,030,452
[45] Date of Patent: Feb. 29, 2000

[54] PLANARIZED GROWTH OF III-V COMPOUND

[75] Inventor: Tatsuya Takeuchi, Kawasaki, Japan

[73] Assignee: Fujitsu Limited, Kawasaki, Japan

[21] Appl. No.: 08/449,221

[22] Filed: May 24, 1995

[30] Foreign Application Priority Data

Jul. 26, 1994 [JP] Japan .................................. 6-174008
Mar. 20, 1995 [JP] Japan .................................. 7-061017

[51] Int. Cl.[7] .................................................. C30B 25/04
[52] U.S. Cl. ........................ 117/104; 117/101; 117/923; 438/289; 438/41
[58] Field of Search ................... 117/101, 104, 117/923; 438/289, 41

[56] References Cited

U.S. PATENT DOCUMENTS

| | | |
|---|---|---|
| 5,104,824 | 4/1992 | Clausen et al. |
| 5,153,147 | 10/1992 | Karlicek ................................. 117/104 |
| 5,212,113 | 5/1993 | Azoulay et al. .......................... 117/95 |
| 5,298,456 | 3/1994 | Unozawa .................................. 372/45 |
| 5,470,785 | 11/1995 | Kondo ...................................... 438/41 |

*Primary Examiner*—Robert Kunemund
*Attorney, Agent, or Firm*—Armstrong, Westerman, Hattori, McLeland & Naughton

[57] ABSTRACT

A method of manufacturing a semiconductor device includes the steps of preparing a semiconductor substrate having a step on a surface thereof and growing a group III–V compound semiconductor layer on a surface of the semiconductor substrate by metal organic vapor phase epitaxy using a source gas added with halogenated hydrocarbon containing one or two halogen atoms per one molecule. The surface of a substrate with a step thereon can be planarized by depositing an embedding layer on a lower level area.

24 Claims, 11 Drawing Sheets

PLANARIZED GROWTH OF III-V COMPOUND

BACKGROUND OF THE INVENTION a) Field of the Invention

The present invention relates to a semiconductor device and a method of manufacturing the same, and more particularly to an embedded mesa semiconductor device such as a laser and a method of manufacturing the same.

b) Description of the Related Art

Optical communications technique utilizing semiconductor lasers and optical fibers has recently developed remarkably. Communications lines of main links have been replaced by optical fibers in place of electrical cables. Because of an expected increase of information processing amount of personal use, optical fibers are forecasted to be connected to houses.

Figure 11:
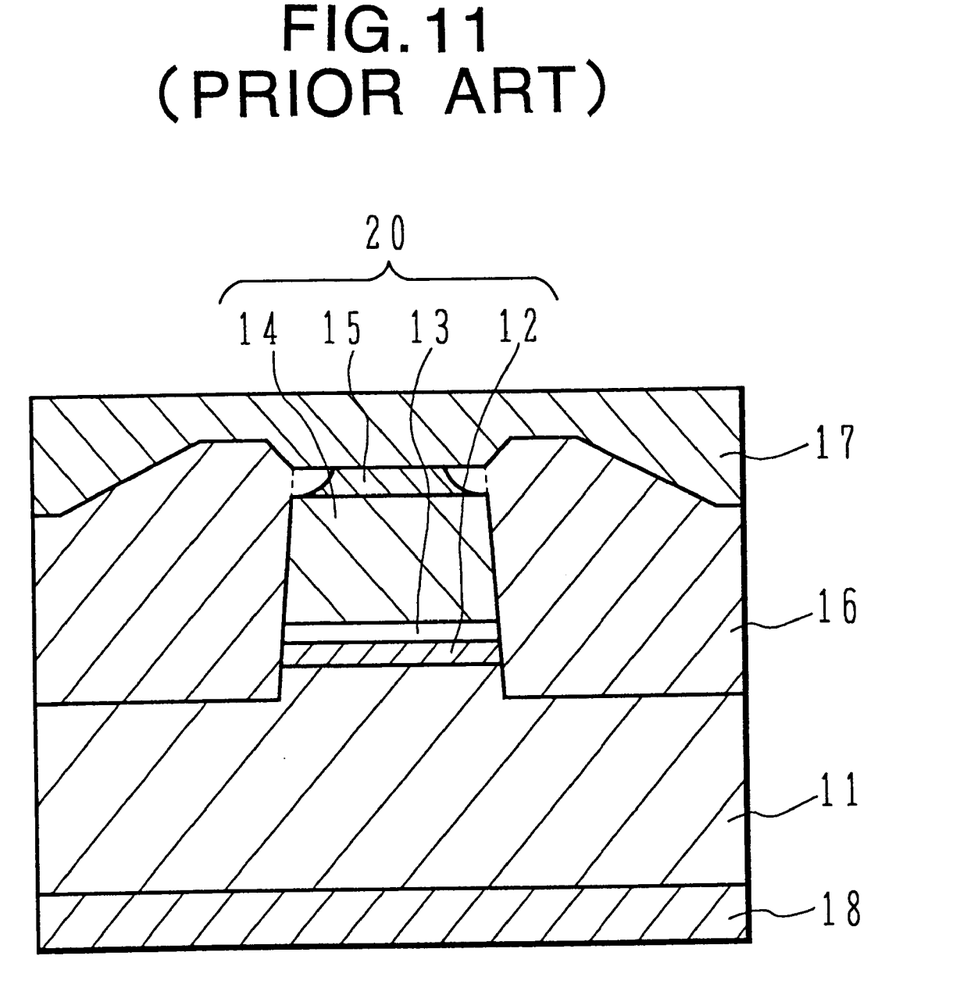
FIG. 11 is a cross sectional view of a conventional embedded mesa semiconductor laser.

FIG. 11 shows an example of a conventional embedded mesa semiconductor laser constituted by an n-type InP substrate 11, a mesa structure 20, an Fe doped semi-insulating InP embedding layer 16, a p-side electrode 17, and an n-side electrode 18.

On the n-type InP substrate 11, an n-type InGaAsP guide layer 12, a non-doped InGaAsP active layer 13, a p-type InP clad layer 14, and a p-type InGaAsP contact layer 15 are grown in this order by metal organic vapor phase epitaxy (MOVPE) and selectively etched by dry etching to form the mesa structure 20. The surface of the n-type InP substrate 11 is lightly etched during the dry etching.

The Fe doped semi-insulating InP embedding layer 16 is formed covering the side walls of the mesa structure 20 and the exposed surface of the n-type InP substrate 11, by MOVPE using a source gas containing carbon tetrachloride ($CCl_4$) or 1, 1, 1 trichloroethane ($C_2H_3Cl_3$). The upper surface of the semi-insulating InP embedding layer 16 is made to be generally the same height as the upper surface of the mesa structure 20.

The p-side electrode 17 is formed covering the upper surface of the mesa structure 20 and the upper surface of the Fe doped semi-insulating InP embedding layer 16, and forms an ohmic contact with the p-type InGaAsP layer 15. The n-side electrode 18 is formed on the bottom of the n-type InP substrate and forms an ohmic contact with the n-type InP substrate 11.

As compared to wet etching, dry etching such as reactive ion etching has better controllability of etching amount, better reproductivity, and better uniformity of large area etching. MOVPE is capable of uniformly forming a layer on a large area of a substrate, and is suitable for mass production of semiconductor lasers by using dry etching.

By adding carbon tetrachloride ($CCl_4$) or 1, 1, 1 trichloroethane ($C_2H_3Cl_3$) to the source gas when the embedding layer is deposited, the surface of the substrate is more planarized.

The substrate surface planarized by depositing the embedding layer by adding carbon tetrachloride ($CCl_4$) or 1, 1, 1 trichloroethane ($C_2H_3Cl_3$) to the source gas, however, is not sufficient for practical use. As shown in FIG. 11, the surface of the embedding layer 16 swells up at the area near the mesa structure 20. The higher becomes the mesa structure, the more noticeable becomes this swell.

This step on the substrate surface leads to an insufficient patterning precision at the succeeding photolithography process and results in a lowered manufacturing yield.

If the amount of additive chlorine is increased or the growth temperature is increased in order to more planarize the substrate surface, the edges of the p-type InGaAsP contact layer 15 are etched during the growth of the embedding layer 16. The effective width of the p-type InGaAsP contact layer 15 is therefore reduced and the contact resistance increases.

Because of insufficient planarization, the thickness of the embedding layer is reduced at the area remote from the mesa structure. Electrostatic capacitance between the electrode formed on the thinned embedding layer and the substrate becomes large, and the high frequency characteristics are degraded.

SUMMARY OF THE INVENTION

It is an object of the present invention to provide a technique of planarizing the surface of a substrate having a step thereon by depositing an embedding layer on a lower level area.

According to one aspect of the present invention, there is provided a method of manufacturing a semiconductor device including the steps of: preparing a semiconductor substrate having a step on a surface thereof; and growing a group III–V compound semiconductor layer on a surface of the semiconductor substrate by metal organic vapor phase epitaxy using a source gas added with halogenated hydrocarbon containing one or two halogen atoms per one molecule.

According to another aspect of the present invention, there is provided a method of manufacturing a semiconductor device including the steps of: preparing a substrate having a compound semiconductor surface of a (100) plane; forming a mesa structure on a surface of the substrate, a side wall of the mesa structure having a plane tilted from a (011) plane toward a <111>A direction; and forming a compound semiconductor embedding layer covering an area of the surface of the substrate where the mesa structure is not formed and the side wall of the mesa structure, through metal organic vapor phase epitaxy by using source gas added with halide.

According to still another aspect of the present invention, there is provided a method of manufacturing a semiconductor device including the steps of: preparing a substrate having a compound semiconductor surface; forming a mesa structure on a surface of the substrate; forming an uneven surface of recesses and projections on the surface of the substrate at an area near the mesa structure; and forming a compound semiconductor embedding layer covering an area of the surface of the substrate where the mesa structure is not formed and a side wall of the mesa structure, through metal organic vapor phase epitaxy by using source gas added with halide.

According to still another aspect of the present invention there is provided a method of manufacturing a semiconductor device including the steps of: preparing a substrate having a compound semiconductor surface; forming a mesa structure on the surface of the substrate; forming a first compound semiconductor embedding layer covering an area of the surface of the substrate where the mesa structure is not formed and a side wall of the mesa structure, through metal organic vapor phase epitaxy; and forming a second compound semiconductor embedding layer on a surface of the first compound semiconductor embedding layer, through metal organic vapor phase epitaxy by using source gas added with halide.

It is preferable to set a growth temperature at the step of forming a second compound semiconductor embedding layer lower than that at the step of forming a first compound semiconductor embedding layer.

According to a further aspect of the present invention, there is provided a semiconductor device including: a compound semiconductor substrate having a plane near a (100) plane; a mesa structure formed on a surface of the compound semiconductor substrate, a side wall of the mesa structure having a plane tilted from a (011) plane in a <111>A direction; and an embedding layer covering an area of the surface of the compound semiconductor substrate where the mesa structure is not formed and the side wall of the mesa structure.

According to another aspect of the present invention, there is provided a semiconductor device including: a compound semiconductor substrate with an upper surface; a mesa structure formed on the upper surface of the compound semiconductor substrate; an uneven surface formed on the upper surface of the compound semiconductor substrate at an area near the mesa structure; and an embedding layer covering an area of the upper surface of the compound semiconductor substrate where the mesa structure is not formed and a side wall of the mesa structure.

When a compound semiconductor layer is grown through MOVPE by adding material containing halogen atoms to source gas, the surface of the compound semiconductor layer is etched at the same time when the layer is deposited. This etching may be ascribed to acid such as HCl generated through decomposition of the material containing halogen atoms.

An etching speed changes with crystal plane of the growth surface of a compound semiconductor layer if the layer is grown by adding halogenated hydrocarbon containing one or two halogen atoms per one molecule. This may be ascribed to that the surface of the compound semiconductor layer functions as catalyst when halogenated hydrocarbon decomposes and the catalyst function changes with crystal plane. If an etching speed changes, the substantial growth speed of a compound semiconductor layer changes.

The surface of a substrate having a step has growth surfaces having different crystal planes. If halogenated hydrocarbon is added to source gas in growing a compound semiconductor layer on this substrate, the growth speed changes with crystal plane. It is therefore possible to preferentially grow the compound semiconductor layer on a surface having a particular crystal plane.

For example, if a compound semiconductor layer is grown on a substrate formed with a mesa structure thereon, under the conditions which reduce a growth speed on the side walls of the mesa structure and increase a growth speed on the substrate surface, it becomes possible to embed the peripheral area of the mesa structure so as to have a generally flat surface.

At the initial growth stage when a compound semiconductor layer is grown by MOVPE on a substrate having a mesa structure thereon by adding halide to source gas, a thick film is formed at the area near the mesa structure. This may be ascribed to a mechanism that atoms attached on the substrate surface migrate and climb the side walls of the mesa structure.

It is possible to suppress the climb and growth of atoms on the side walls by tilting the side walls of a mesa structure from (011) plane in <111>A direction assuming (100) plane for the upper surface of a compound semiconductor body. This may be ascribed to the surface characteristics of the side walls which suppress the climb and growth.

The climb and growth of a film on the side walls of a mesa structure can also be suppressed by forming an uneven surface on compound semiconductor body at the area near the mesa structure. This may be ascribed to a mechanism that the uneven surface at the area near the mesa structure suppresses migration of atoms attached to this area.

The cross section of an embedding layer near a mesa structure formed on a substrate by MOVPE changes with a growth temperature. There is a strong tendency that at a relatively low growth temperature, although it is easy to planarize the embedding layer at the area near a mesa structure, the embedding layer is grown faster and thicker than at the area apart from the mesa structure. There is also a strong tendency that at a relatively high growth temperature, although the thickness of the embedding layer becomes uniform over the whole area, a large swell is formed at the area near the mesa structure at the later period during the growth.

By using a high growth temperature at the initial growth stage and using a low growth temperature thereafter, it becomes possible to suppress a fast growth near at the mesa structure and planarize the area near the mesa structure.

By growing a crystal layer by MOVPE on a substrate having a step thereon in the above manner, the lower level area can be embedded and the surface of the embedding layer can be made generally flat. By applying this technique to manufacturing an embedded mesa semiconductor layer, the surface of the laser formed with a mesa laser diode can be made generally flat.

With the planarized surface, the precision of photolithography is improved and a manufacturing yield can be improved. Since the thickness of an embedding layer is made uniform even at the area apart from a mesa diode, electrostatic capacitance between electrodes on the embedding layer and the substrate is lowered. The high frequency characteristics of semiconductor lasers can therefore be improved.

DETAILED DESCRIPTION OF THE PREFERRED EMBODIMENTS

A method of manufacturing an embedded mesa semiconductor laser according to the first embodiment of the invention will be described with reference to FIGS. 1A to 1E.

Figure 1A:
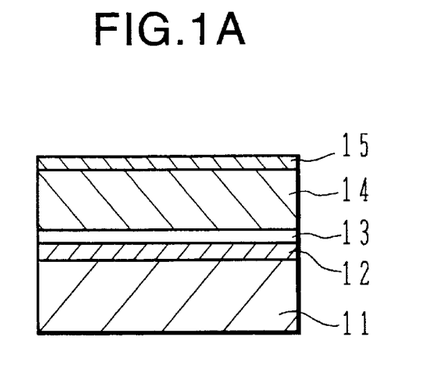
FIGS. 1A to 1E are cross sectional views of a substrate explaining a method of manufacturing an embedded mesa semiconductor laser according to a first embodiment of the invention.

As shown in FIG. 1A, on an n-type InP substrate 11 having a (100) plane, an n-type InGaAsP guide layer 12, an InGaAsP active layer 13, a p-type InP clad layer 14, and a p-type InGaAsP contact layer 15 are grown.

The n-type InGaAsP guide layer 12 has a bandgap wavelength of 1.3 $\mu$m, an electron concentration of $1\times10^{17}\text{cm}^{-3}$, and a thickness of 0.2 $\mu$m. The InGaAsP active layer 13 has a bandgap wavelength of 1.55 $\mu$m and a thickness of 0.1 $\mu$m. The p-type InP clad layer 14 has a hole concentration of $5\times10^{17}\text{cm}^{-3}$ and a thickness of 1.5 $\mu$m. The p-type InGaAsP contact layer 15 has a bandgap wavelength of 1.3 $\mu$m, a hole concentration of $5\times10^{8}\text{cm}^{-3}$, and a thickness of 0.2 $\mu$m. The n-type InP substrate 11 functions also as a clad layer with the guide layer.

Figure 1B:
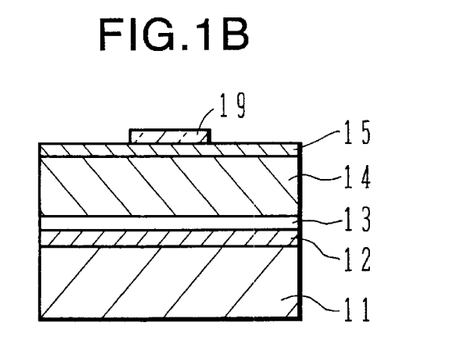

As shown in FIG. 1B, on the surface of the p-type InGaAsP contact layer 15, a striped $SiO_2$ pattern 19 is formed by chemical vapor deposition (CVD) and photolithography, the pattern having a width of 2 $\mu$m and a thickness of 0.3 $\mu$m. The pattern is elongated perpendicular to the plane of sheet.

Figure 1C:
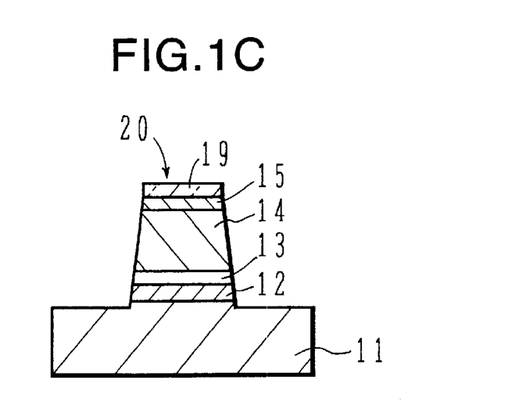

As shown in FIG. 1C, by using the $SiO_2$ pattern 19 as a mask, etching is performed to a depth of 2.5 $\mu$m from the surface of the p-type InGaAsP contact layer 15 to form a mesa structure 20. At this time, the n-type InP substrate 11 is also etched to a depth of 0.5 $\mu$m from the surface thereof. For example, a parallel plate plasma etcher is used as an etching system, a mixed gas of ethane, hydrogen, and oxygen is used as an etching gas, and an RF power of 300 W is supplied.

Figure 1D:
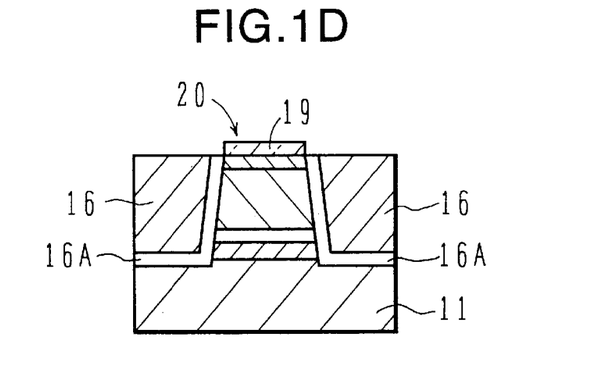

As shown in FIG. 1D, an Fe doped semi-insulating embedding layer 16 is deposited to a thickness of 2.5 $\mu$m by MOVPE, covering the side walls of the mesa structure 20 and the exposed surface of the n-type InP substrate 11.

The source gas is trimethylindium (TMI) and phosphine ($PH_3$), and the Fe dopant material is ferrocene (($C_5H_5$)$_2$Fe). The initial growth is performed for 5 minutes by using only the source gas without adding monochloroethane, and the growth after 5 minutes is performed with the addition of hydrogen diluted 2% monochloroethane ($C_2H_5Cl$) to the source gas. The flow rate of TMI is 0.95 sccm, the flow rate of monochloroethane is 4 sccm, a V/III ratio is 120, and the growth temperature is 600 °C.

Under the above conditions, the growth speed of the InP embedding layer 16 was about 2.5 $\mu$m/h and the resistivity was $1\times10^9$ $\Omega$m. In this manner a semi-insulating InP embedding layer 16A is formed during the initial growth on the side walls of the mesa structure 20 and the exposed surface of the n-type InP substrate 11, and on the semi-insulating InP embedding layer 16A, the semi-insulating InP embedding layer 16 is grown by adding monochloromethane to the source gas.

Figure 1E:
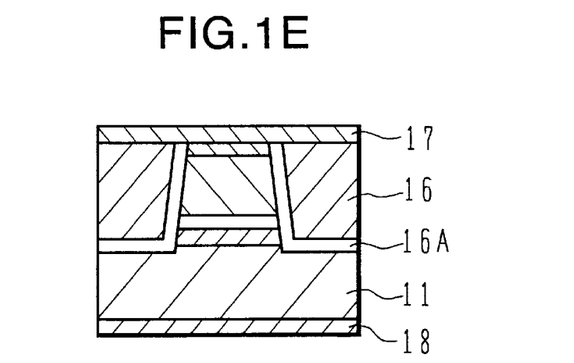

As shown in FIG. 1E, after the $SiO_2$ pattern 19 is removed, a p-side electrode 17 is formed which is a laminate of Ti/Pt/Au in this order from the bottom. On the bottom of the n-type InP substrate 11, an n-side electrode 18 is formed which is a laminate of AuGe/Au in this order from the substrate side.

In the first embodiment shown in FIGS. 1A to 1E, a relatively flat surface can be obtained by adding monochloroethane to the source gas when the embedding layer 16 is deposited.

The amount of additive monochloroethane is preferably set so that a ratio of the number of chlorine atoms to the number of group III atoms in the source gas becomes 0.01 to 100, more preferably 40 or smaller. As the amount of additive chlorine reduces, the planarizing effect becomes small. As the amount of additive chlorine increases, the growth speed of the InP embedding layer lowers to an unpractical level, or the layer is not grown. The ratio of the number of chlorine atoms to the number of group III atoms at a "0" growth speed is about 30 at a growth temperature of 575° C. and about 10 at a growth temperature of 650° C. If the ratio of the number of chlorine atoms to the number of group III atoms is 40 at a growth temperature of 550° C., the growth speed becomes faster than 0.

An optimum growth temperature is 550 to 650° C. At a temperature higher than 650° C., the embedding layer can be planarized without adding monochloroethane. In order to suppress re-diffusion of impurities, degradation of the sharpness of heterojunction, or other undesired processes, it is preferable to set the growth temperature to 650° C. or lower. At a temperature below 550° C., planarization is degraded and a problem of polycrystalline InP growth on the $SiO_2$ pattern 19 on the mesa structure occurs.

A planarized surface of the embedding layer may be ascribed to suppression of growth of the embedding layer on the side walls of the mesa structure by the addition of molecules containing chlorine. The present inventor has found that InGaAsP is more etched than InP if chlorine is added. Since InP becomes difficult to be grown on the side walls of the mesa structure by the addition of molecules containing chlorine, the side walls of the p-type InGaAsP contact layer 15 are exposed for a longer time to atmosphere containing chlorine. As a result, the edges of the contact layer 15 are etched and the effective width thereof is narrowed.

Since molecules containing chlorine are not added during the initial growth of the embedding layer 16, the InP layer can be deposited while suppressing etching of the edges of the p-type InGaAsP contact layer 15. Once the InP layer is deposited, the InGaAsP layer is not directly exposed to atmosphere containing chlorine. After the side walls of the mesa structure are covered with the InP layer, molecules containing chlorine are added. Instead of not adding molecules containing chlorine at all during the initial growth of the embedding layer 16, a small additive amount may be used first and then the additive amount may be increased.

Next, planarization effect dependency upon a kind of chlorine source material will be described.

FIGS. 2A to 2D are sketches of cross sectional photographs of substrates with InP embedding layers being deposited around mesa structures formed on the substrates, respectively by adding hydrogen chloride (HCl), trichloroethane, monochloroethane, and monochloromethane to source gas.

The height of the mesa structure is 2.5 μm, the growth temperature is 600° C., and the flow rate of TMI is 0.95 sccm.

Figure 2A:
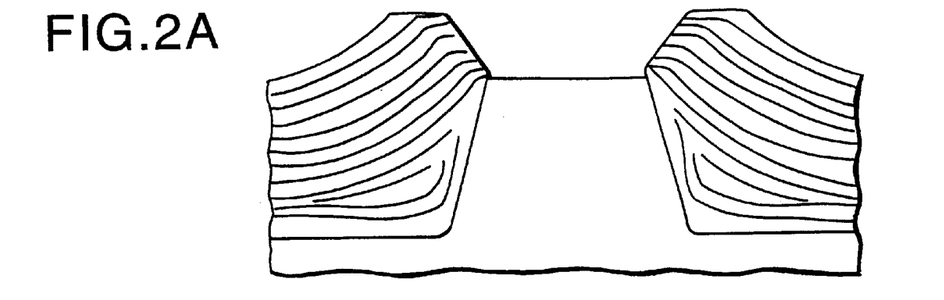
FIGS. 2A to 2D are diagrams sketched from cross sectional photographs of mesa structures formed on substrate surfaces and embedding layers formed around the mesa structures.
Figure 2B:
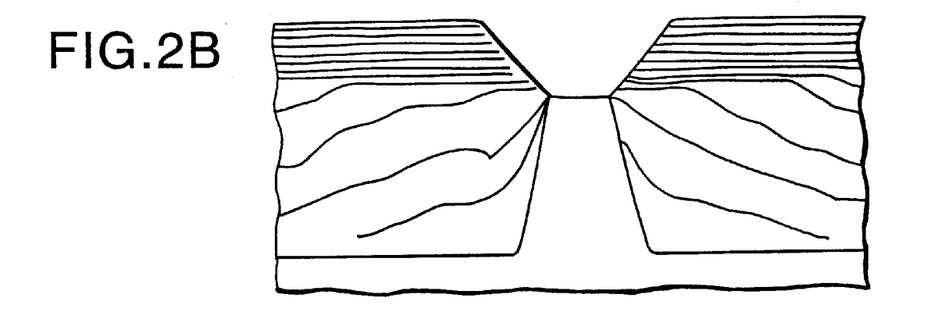
Figure 2C:
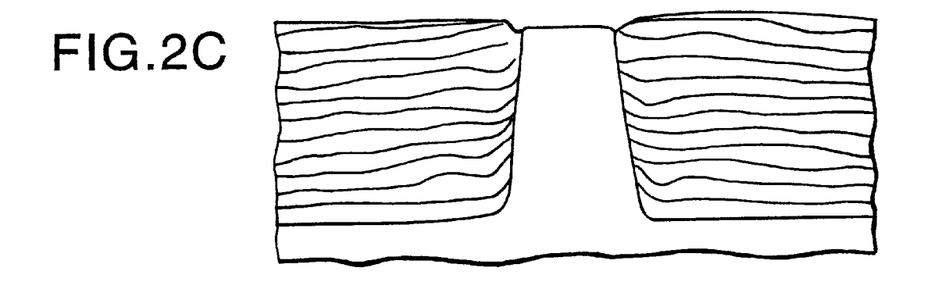
Figure 2D:
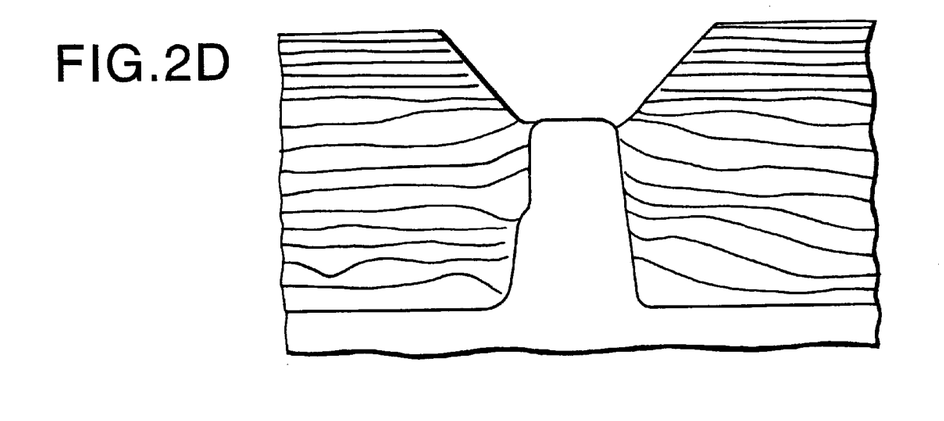

The flow rate of HCl in FIG. 2A is 0.22 sccm, the flow rate of trichloroethane in FIG. 2B is 0.12 sccm, the flow rate of monochloroethane in FIG. 2C is 10 sccm, and the flow rate of monochloromethane in FIG. 2D is 12 sccm. In order to observe the growth process of the InP embedding layer, thin layers of InGaAsP or InAsP are formed during the growth of embedding layer at a constant time interval. Under the above conditions, the growth speed of the InP embedding layer was about 2.0 μm/h in all the cases of FIGS. 2A to 2D.

Laminar curves in the embedding layers of FIGS. 2A to 2D indicate thin layers of InGaAsP or InAsP. Surfaces of the embedding layer during the growth is considered to extend along these laminar curves.

As shown in FIG. 2A, if HCl is added to the source gas, the surface of the embedding layer swells up at the area near the mesa structure and rapidly lowers at the area slightly apart from the mesa structure.

As shown in FIG. 2B, if trichloroethane is added to the source gas, generally the flat growth surface is formed at the area near the mesa structure. However, the laminar curves representing growth surfaces gradually lower at the area somewhat apart from the mesa structure. This means that although generally the flat surface can be formed at the area very near the mesa structure, planarization is not sufficient in the broad area around the mesa structure.

As shown in FIGS. 2C and 2D, if monochloroethane or monochloromethane is added to the source gas, a relatively flat growth surface of the embedding layer can be formed both at the area near the mesa structure and at the area apart from the mesa structure. It is therefore possible to form a planarized embedding layer by adding hydrocarbon chloride containing one chlorine atom per one molecule to the source gas.

The amount of additive monochloromethane is preferably set so that a ratio of the number of chlorine atoms to the number of group III atoms in the source gas becomes 0.01 to 200, more preferably 80 or smaller. As the amount of additive chlorine reduces, the planarizing effect becomes small. As the amount of additive chlorine increases, the growth speed of the InP embedding layer lowers to an unpractical level, or the layer is not grown. The growth temperature is preferably 550 to 650° C. when adding monochloromethane to the source gas, similar to when adding monochloroethane.

A more planarized embedding layer can be formed by adding monochloroethane or monochloromethane to the source gas, than by adding HCl or trichloroethane. The reason for this may be as follows.

The embedding layer surface improved by adding hydrocarbon chloride to source gas has been ascribed to HCl generated by decomposition of hydrocarbon chloride. Therefore, only the amount of HCl has conventionally been considered to influence the planarizing effect. The present inventor has found that the planarizing effect is changed not only with the amount of HCl but also with a kind of chlorine source material. As shown in FIGS. 2B to 2D, it has been found that the planarizing effect becomes larger as the chlorine source material has a less number of chlorine atoms per one molecule of hydrocarbon chloride. This reason may be ascribed to ease of decomposition of chlorine material and to dependency of ease of decomposition upon crystal plane.

Figure 3:
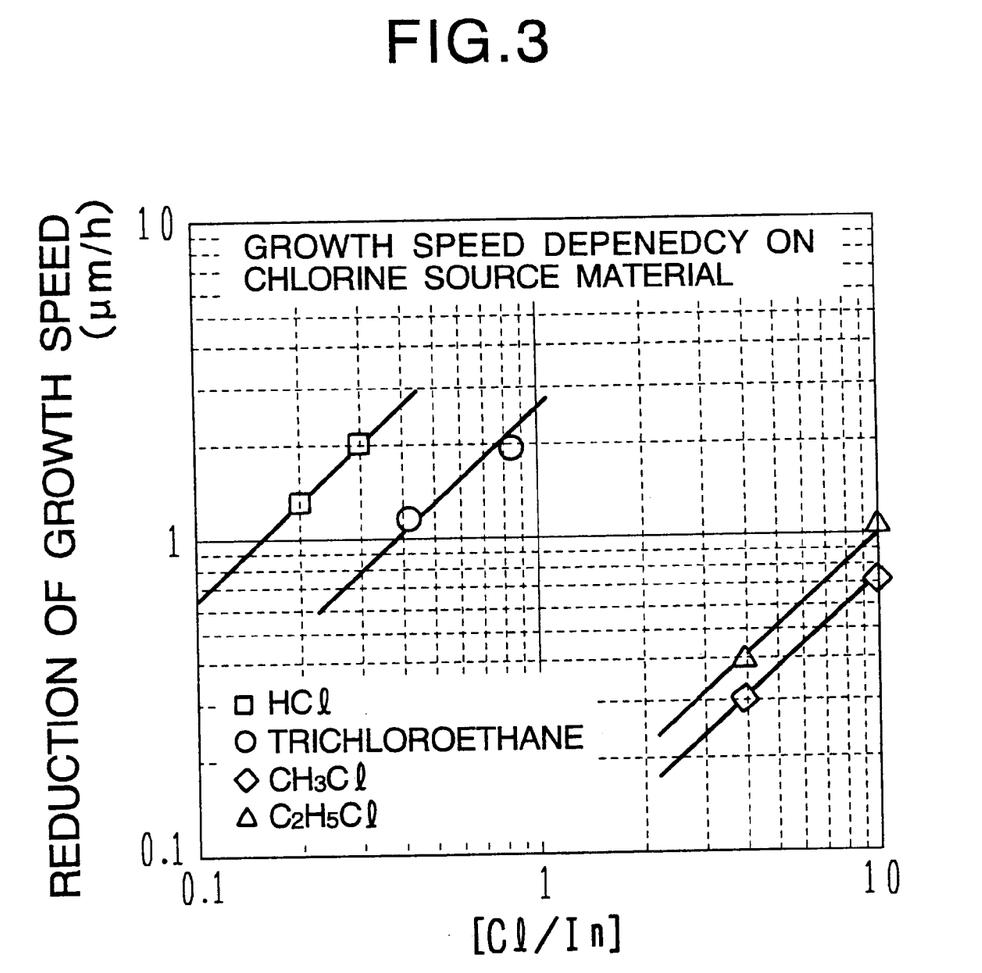
FIG. 3 is a graph showing growth rate reduction dependency upon a kind of chlorine source material added to source gas.

FIG. 3 is a graph showing a relationship between an amount of additive chlorine and a reduction in the growth speed of an embedding layer. The abscissa represents a mol ratio of Cl atoms to In atoms in source gas, and the ordinate represents a reduction in the growth speed of an embedding layer in the unit of μm/h. Square, circle, triangle, and diamond symbols shown in FIG. 3 respectively correspond to addition of HCl, trichloroethane, monochloroethane, and monochloromethane to source gas. Substrates used are (100) plane InP substrates and the growth temperature was 600° C.

It is known that if chlorine source material is added to source gas, the growth speed is lowered by an etching function of HCl generated by decomposition. Therefore, the graph shown in FIG. 3 may be considered to indicate ease of decomposition of each chlorine source material. It is necessary to add monochloroethane or monochloromethane about 30 times more than trichloroethane if the same reduction of growth speed is to be obtained. This suggests that the decomposition efficiency of monochloroethane or monochloromethane is about 1/30 that of trichloroethane.

In other words, for obtaining a specific reduction in the growth rate, hydrocarbon chlorides having a low decomposition efficiency should be added more compared to hydrocarbon chlorides having a high decomposition efficiency.

Figure 4:
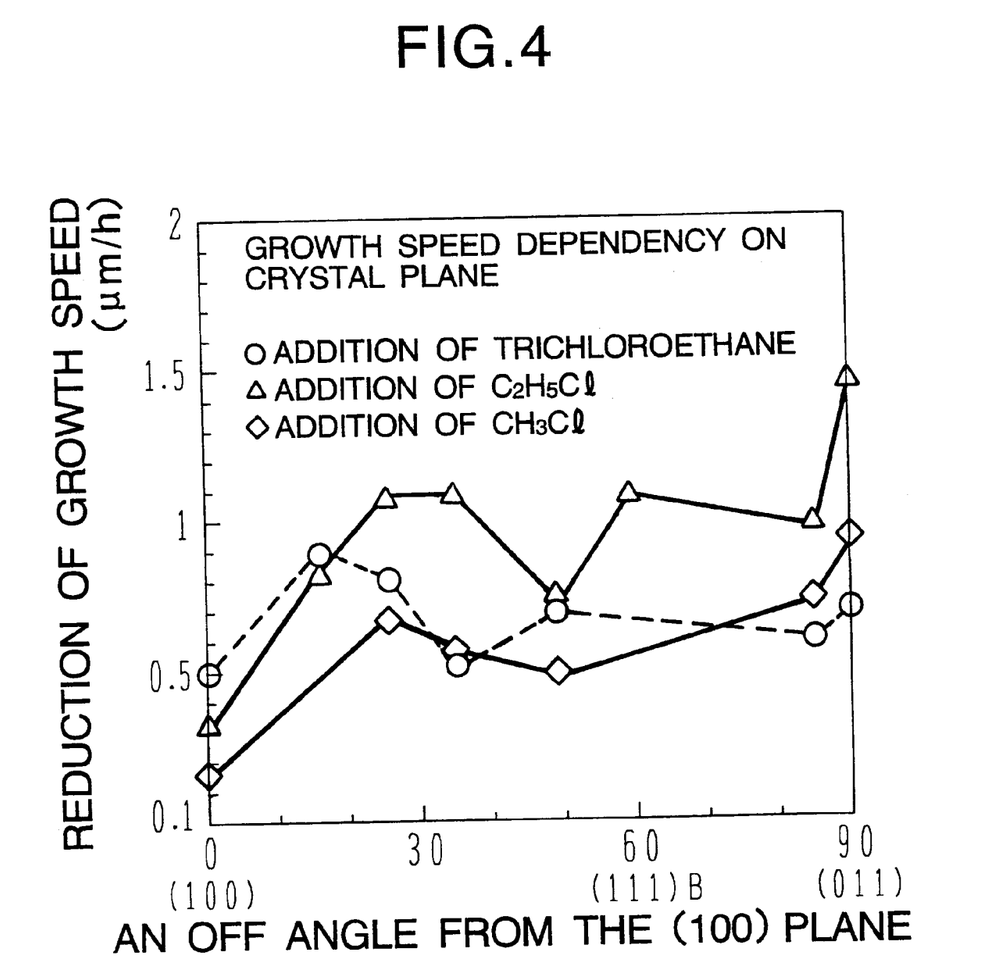
FIG. 4 is a graph showing crystallographic plane dependency of a growth rate reduction with a variety of chlorine source materials added to source gas.

FIG. 4 is a graph showing growth speed reduction dependency upon crystal plane. The abscissa represents an off angle of the growth surface from the (100) plane, and the ordinate represents a reduction in the growth speed of an embedding layer in the unit of μm/h. Circle, triangle, and diamond symbols in FIG. 4 respectively correspond to addition of trichloroethane, monochloroethane, and monochloromethane to source gas. The growth temperature was set to 575° C.

A reduction of growth speed caused by the addition of monochloroethane or monochloromethane to source gas is smallest at the plane (100) and largest at the plane (011). The difference between the maximum and minimum growth speed reductions is 0.7 to 1.1 μm/h. This difference may be reasoned as that the InP surface functions as catalyst for decomposition of hydrocarbon chloride and that the catalyst function changes with crystal plane. In contrast to this, a reduction of growth speed by adding trichloroethane to source gas changes less with crystal plane.

As seen from FIG. 4, with the addition of monochloroethane or monochloromethane to source gas, a growth speed on the side walls of the mesa structure having a crystal plane near the plane (011) is slower than that on the plane (100). Therefore, growth on the exposed substrate surface becomes more dominant than that on the side walls of the mesa structure. This may be a reason that a planarized embedding layer can be grown.

It is considered from the above studies that as the hydrocarbon chloride to be added to source gas, those having a lower decomposition efficiency are more suitable for planarization than those having a higher decomposition efficiency. In general, a decomposition efficiency lowers as a hydrocarbon chloride molecule has less chlorine atoms. Although chlorine source material having one chlorine atom per one molecule is used in the experiments described with FIGS. 2C and 2D, relatively good planarization can be expected even if chlorine source material having two chlorine atoms per one molecule is used. For example, source gas may be added with chlorine source materials having one or two chlorine atoms per one molecule, such as alkyl chloride, vinyl chloride, aryl chloride, allyl chloride, and benzyl chloride.

In the above embodiment, chlorine source material is added to source gas. The same effects may be expected even if material containing halogen element other than chlorine is added to source gas. For example, source gas may be added with halogenated hydrocarbon such as hydrocarbon fluoride, hydrocarbon bromide, and hydrocarbon iodide.

In the above embodiment, the peripheral area of a mesa structure is embedded by using a (100) plane InP substrate. This embodiment may be applied to planarization of a specific area or to film formation on only a specific area, by using the growth speed dependency upon crystal plane. For example, the embodiment may be applied to forming a semiconductor device on a substrate having a crystal plane such as the (111)A plane, (111)B plane, and (011) plane.

In the first embodiment, a method of planarizing an embedding layer has been described paying attention to chlorine material to be added to source gas used in MOVPE. Next, another method of planarizing an embedding layer will be described paying attention to the shape of a substrate.

Figure 5A:
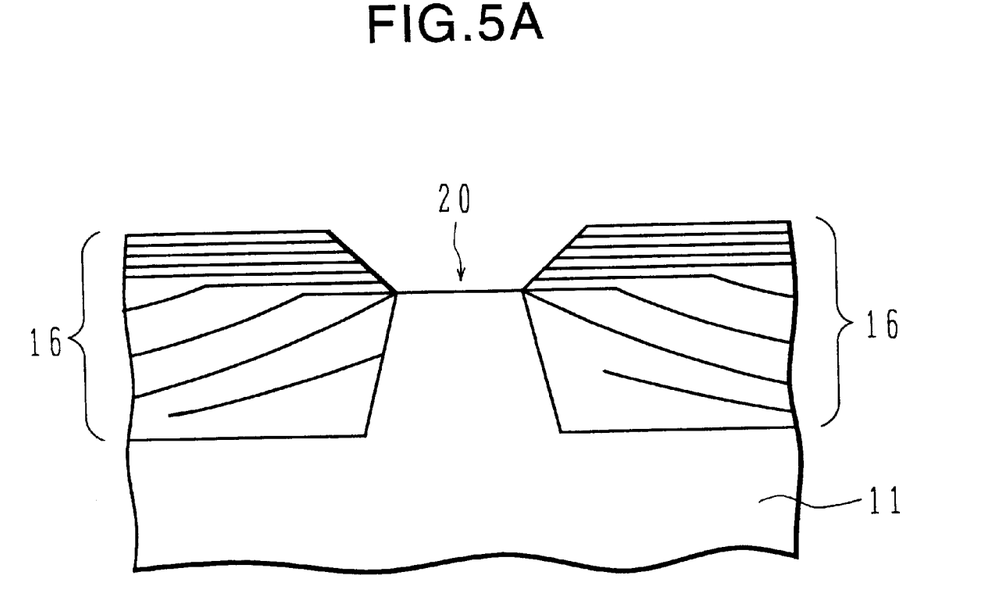
FIGS. 5A and 5B are a diagram sketched from a photograph of a mesa structure formed on a substrate surface and an embedding layer formed around the mesa structure, and a cross sectional view of a substrate illustrating the growth of an embedding layer at its initial stage.

FIG. 5A is a sketch of a cross sectional photograph of a substrate on which an embedding layer is deposited through MOVPE with the addition of monochloromethane to source gas at a growth temperature of 575° C. A mesa structure 20 is formed on the surface of an InP substrate 11. An InP embedding layer 16 is formed, covering the side walls of the mesa structure 20 and the surface of the InP substrate 11 outside of the mesa structure 20.

Thin InGaAsP layers were formed periodically during the growth of the InP embedding layer 16. Laminar curves in the InP embedding layer shown in FIG. 5A indicate thin InGaAsP layers. The laminar curves are considered to indicate surfaces of the InP embedding layer 16 during the growth.

It is seen from FIG. 5A that at the initial growth stage, the InP embedding layer is not formed at the upper area of the side walls of the mesa structure 20. It is also seen that the embedding layer is formed on the surface of the substrate 11 thicker at the area near the mesa structure 20 than the other far areas. This may be considered as follows.

Figure 5B:
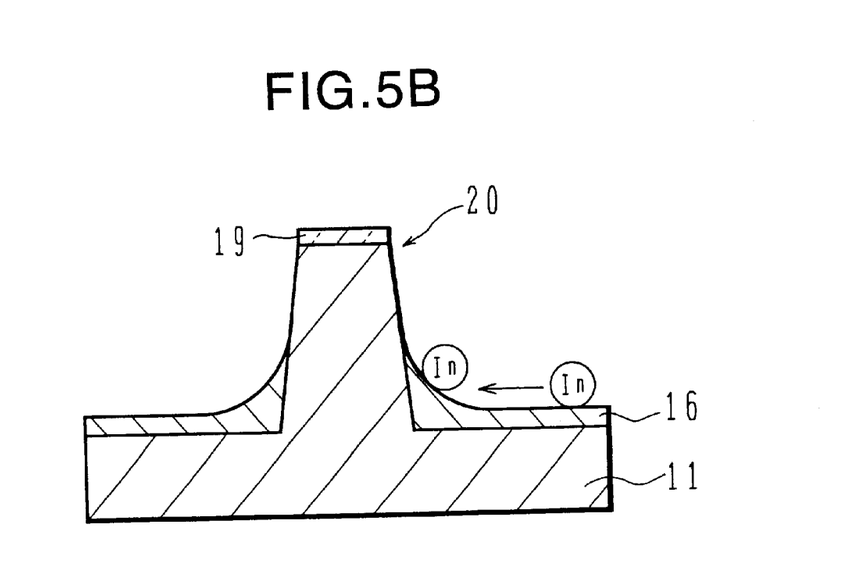

FIG. 5B is a schematic cross sectional view of a substrate explaining how an embedding layer 16 is formed at the initial growth stage. A mesa 20 is formed at the surface of a substrate 11 at its central area, and the upper surface of the mesa 20 is covered with an oxide mask 19. Indium atoms attached to the surface of the substrate 11 migrate along the substrate surface. The migrated In atoms collide with the side walls of the mesa structure 20, and are fixed to the region near the side walls or climb along the side walls and are fixed thereto. The embedding layer 16 thicker than the other areas is considered to be formed in this manner at the area near the side walls of the mesa structure 20. The InP layer is not deposited on the upper surface of the mesa structure 20 because of the existence of SiO₂ pattern.

It can be thought of from the above considerations that the surface of the embedding layer 16 can be planarized if the concentrated deposition on the area near the mesa structure 20 is suppressed. To this end, an alteration of an angle between the side walls of the mesa structure and the substrate and a formation of uneven surfaces on the substrate surface are expected to be effective. These methods will be described below.

A second embodiment will be described in which an angle between the side wall of a mesa structure and the surface of a substrate is altered.

Figure 6:
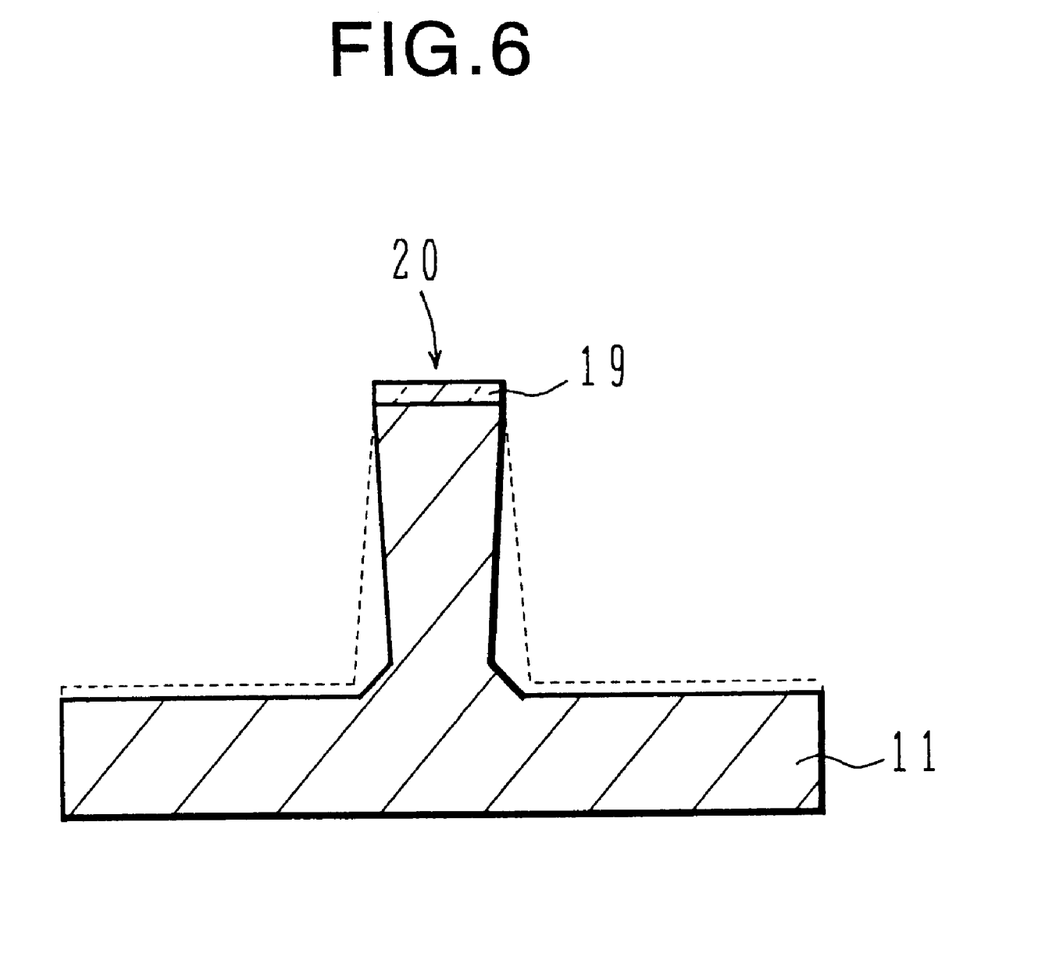
FIG. 6 is a cross sectional view of a substrate formed with a mesa structure used for growing an embedding layer according to a second embodiment of the invention.

FIG. 6 is a cross sectional view of a substrate used by the second embodiment. A mesa structure 20 is formed on the surface of a (100) plane InP substrate 11. The side walls of the mesa structure 20 have a plane near the plane (011) indicated by broken lines in FIG. 6.

An SiO₂ pattern 19 is formed on the upper surface of t he mesa structure 20. By using the SiO₂ pattern 19 as a mask, the mesa side walls and the surface of the substrate 11 are further etched by wet etching using phosphoric acid. With this etching, a plane indicated by solid lines in FIG. 6 having an off angle from the (001) plane toward the <111>A direction appears on the side walls of the mesa structure 20.

An InP embedding layer was deposited on the prepared substrate 11 through MOVPE by adding monochloromethane to source gas. The peripheral area of the mesa structure 20 was embedded generally flat without atoms climbing the side walls of the mesa structure 20. This may be ascribed to that even if migrated In atoms collide with the side walls of the mesa structure, they do not climb the side walls. The off angle from the (001) plane toward the <111>A direction may preferably be about 2 degrees or more.

Next, an application of the second embodiment to an embedded mesa semiconductor laser will be described.

Figure 7A:
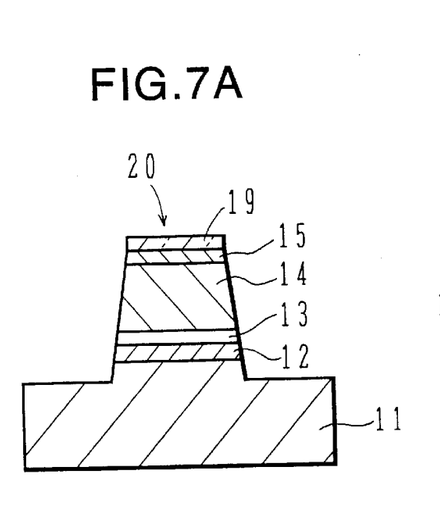
FIGS. 7A to 7D are cross sectional views of a substrate explaining a method of manufacturing an embedded mesa semiconductor laser according to the second embodiment of the invention.

A mesa structure 20 shown in FIG. 7A has the same structure as FIG. 1C.

Figure 7B:
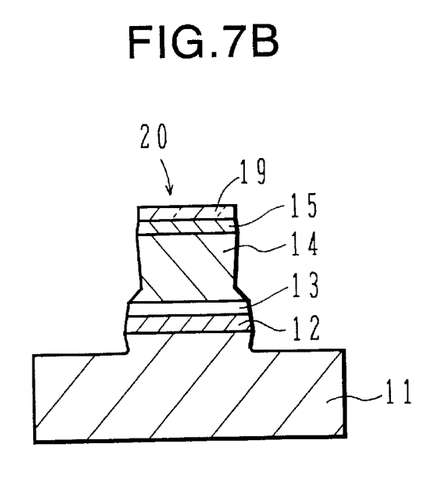

As shown in FIG. 7B, by using an SiO₂ pattern 19 as a mask, the surface of an n-type InP substrate 11 and the side walls of the mesa structure 20 are wet-etched by using phosphoric acid. Phosphoric acid hardly etches InGaAsP layers 12, 13, and 15, but etches only InP layer or layers and the substrate. Therefore, of the side walls of the mesa structure 20, only the bottom region exposing the surface of the n-type InP substrate 11 and the side walls of the p-type InP clad layer 14 are etched.

With this etching using phosphoric acid, a plane having an off angle from the (011) plane toward the <111>A direction appears on the side walls of the p-type InP clad layer 14 and the bottom side regions of the mesa structure 20.

Figure 7C:
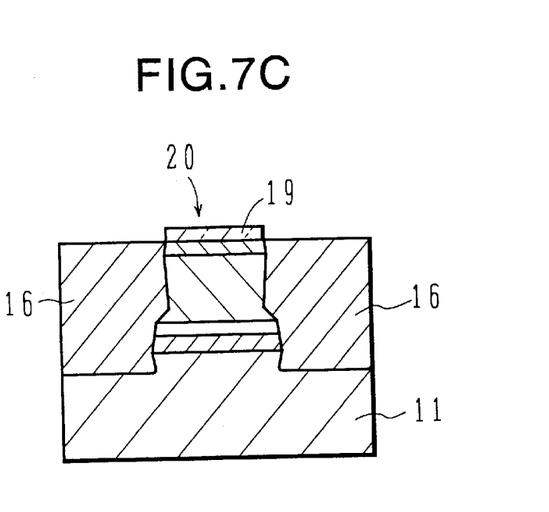

As shown in FIG. 7C, an Fe doped semi-insulating InP embedding layer 16 is deposited to a thickness of 2.5 μm, covering the side walls of the mesa structure 20 and the surface of the n-type InP substrate 11.

The source gas used are TMI and PH₃, Fe dopant material is ferrocene, and hydrogen diluted 2% monochloroethane is added. The flow rate of TMI is 0.95 sccm, the flow rate of monochloroethane is 4.0 sccm, the V/III ratio is 120, and the growth temperature is 600° C.

Under the above conditions, the growth speed of the InP embedding layer 16 was about 3 μ/h, and the resistivity thereof was 1×10⁹ Ωm. In this manner, the semi-insulating InP embedding layer 16 is formed having the upper surface generally flush with the upper surface of the mesa structure 20.

Figure 7D:
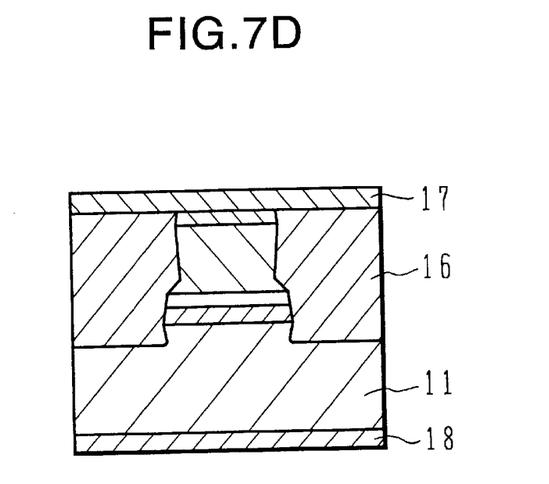

As shown in FIG. 7D, after the SiO₂ pattern 19 is removed, a p-side electrode 17 is formed which is a laminate of Ti/Pt/Au in this order from the bottom. An n-side electrode 18 is formed on the bottom of the n-type InP substrate 11, which is a laminate of AuGe/Au in this order from the substrate side.

In the process of forming the InP embedding layer 16 illustrated in FIG. 7C, the relationship between the surface of the n-type InP substrate 11 and the side walls of the mesa structure 20 is equivalent to the case illustrated in FIG. 6. It is therefore expected to form generally the flat surface, excluding climbing of In atoms on the side walls of the mesa structure 20.

Next, the third embodiment using a substrate with an uneven surface will be described.

Figure 8:
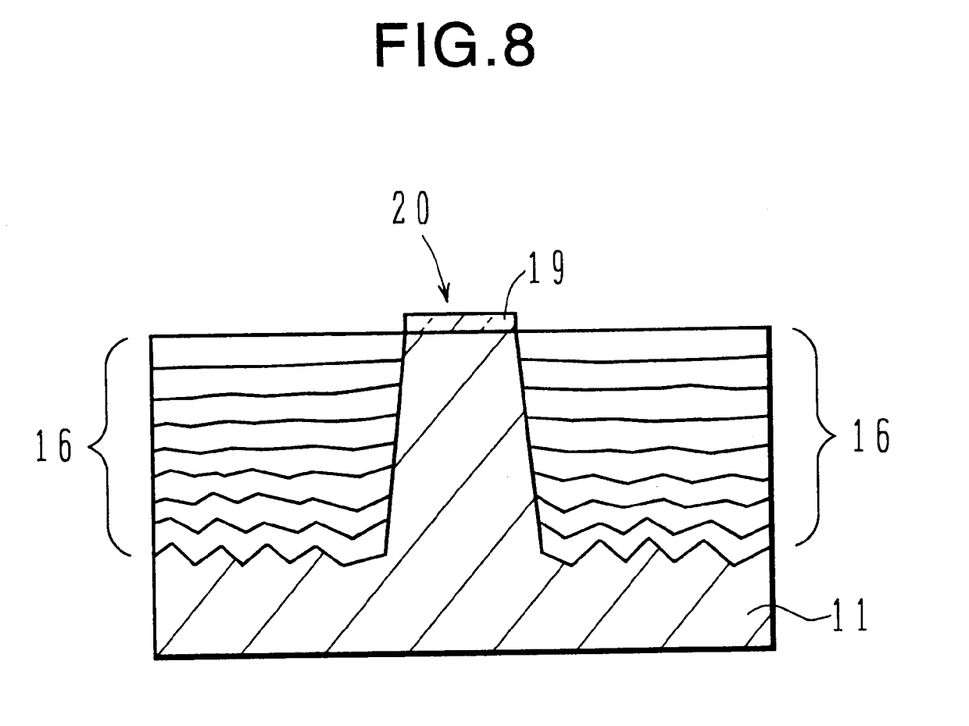
FIG. 8 is a cross sectional view of an embedding layer and a mesa structure formed in accordance with a third embodiment of the invention.

FIG. 8 is a cross sectional view of a substrate used with the third embodiment. A mesa structure 20 is formed on the surface of a (100) plane InP substrate 11. An uneven surface with fine recesses and projections is formed on the InP substrate 11 at the area where the mesa structure 20 is not formed. This uneven surface can be formed by properly selecting the flow rate of etching gas when the InP substrate 11 is dry etched by using a mixed gas of ethane, hydrogen, and oxygen and the $SiO_2$ pattern 19 as a mask.

For example, if a parallel plate plasma etcher is used under the conditions of a power supply of 300 W, an ethane flow rate of 40 sccm, a hydrogen flow rate of 10 sccm, and an oxygen flow rate of 4 sccm, the obtained etched surface is generally a mirror surface. In contrast with this, if the oxygen flow rate is towered to 1 sccm, an uneven etched surface can be formed.

An InP embedding layer 16 was deposited on the prepared substrate 11 through MOVPE with the addition of monochloromethane. The peripheral area of the mesa structure 20 can be embedded generally flat without climbing of In atoms on the side walls of the metal structure 20. This may be ascribed to suppression of migration of in atoms because of the irregular surface of the InP substrate 11. It is preferable to set the maximum depth or height of the uneven surface of the order of 0.2 µm.

In the first embodiment described with FIGS. 1A to 1E, if the etching conditions of the dry etching process illustrated in FIG. 1C are selected properly to form an uneven surface on the n-type InP substrate 11, the embedding method of the third embodiment can be applied to forming an embedded mesa semiconductor laser.

In the second and third embodiments, halide is added to source gas when an embedding layer is grown. Similar effects may be expected even if halide is not added. If halide is added in the second and third embodiments, distinctive additional effects may be expected.

Next, the fourth embodiment of the invention will be described with reference to FIGS. 9A to 9C.

Figure 9A:
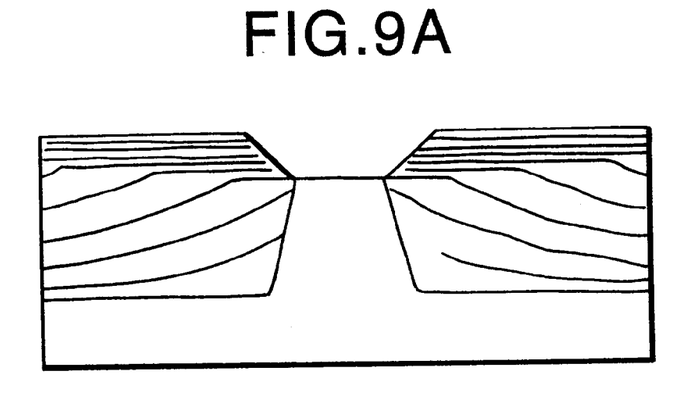
FIGS. 9A and 9B are diagrams sketched from photographs of mesa structures and embedding layers formed by a conventional method.
Figure 9B:
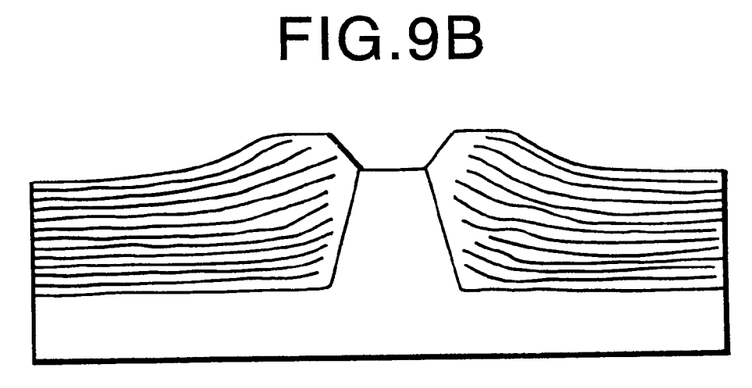

FIGS. 9A and 9B are sketches of cross sectional photographs of substrate with InP embedding layers formed through MOVPE respectively at growth temperatures of 575° C. and 600° C. The embedding layers were grown with the addition of monochloromethane to source gas of TMI and $PH_3$. The peripheral area of the mesa structure formed on the surface of an InP substrate is being embedded with an InP embedding layer. Similar to FIG. 5a, laminar curves depicted in the InP embedding layer indicate surfaces of the embedding layer during its growth.

As seen from FIG. 9A, at the growth temperature of 575° C., a growth speed at the area near the mesa structure is very fast. When the growth surface reaches the upper surface level of the mesa structure, the upward growth speed lowers and a flat surface generally flush with the upper surface of the mesa structure is formed at the area near the mesa structure. As the growth progresses, the flat area expands allowing the area near the mesa structure to be planarized. At the area apart from the mesa structure, however, the thickness of the InP embedding layer becomes thinner than at the area near the mesa structure.

As seen from FIG. 9B, at the growth temperature of 600° C., growth at the area near the mesa structure is slow, and after growth progresses to some degree, swell is quickly formed at the area near the mesa structure. The thickness of the InP embedding layer does not become thin also at the area apart from the mesa structure and takes generally the same level as the height of the mesa structure.

From the experiment results shown in FIGS. 9A and 9B, it is expected to be preferable to control the growth in the following manner. In order to suppress the swell at the area very near the mesa structure and to make the thickness of the embedding layer at the whole area be generally the same as the height of the mesa structure, the growth temperature is set to 600° C. at the preceding growth stage to grow the embedding layer of a uniform thickness before the swell is rapidly formed higher than the mesa structure, and at the succeeding growth stage, the growth temperature is set to 575° C. in order to suppress the swell at the area very near the mesa structure and broaden the flat area. The preceding stage is preferably terminated before the swell occurs.

Figure 9C:
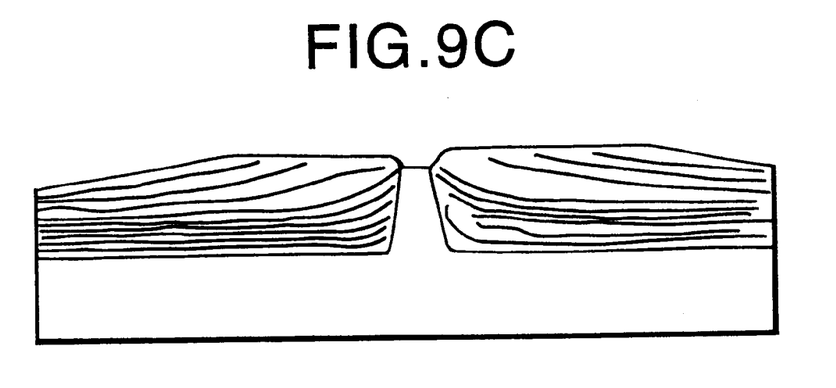
FIG. 9C is a diagram sketched from a photograph of a mesa structure and an embedding layer formed in accordance with a fourth embodiment of the invention.

FIG. 9C is a sketch of a cross sectional photograph of a substrate with an InP embedding layer which is formed by a preceding growth stage at a growth temperature of 600° C. to a thickness of 1.5 µm for a mesa of a height 2.5 µm and a succeeding growth stage at a growth temperature of 575° C. Because of the preceding growth temperature of 600 C., growth of the embedding layer is slow at the area near the mesa structure, climbing the side walls of the mesa structure is suppressed, and a relatively thick embedding layer is formed even at the area apart from the mesa structure. Because of the succeeding growth temperature of 575° C., growth at the area higher than the upper surface of the mesa structure is suppressed and a flat surface is formed at a relatively broad peripheral area of the mesa structure.

By forming an InP embedding layer under proper growth conditions at the preceding and succeeding growth stages in the manner described above, it becomes possible to embed and planarize the peripheral area of the mesa structure. More specifically, it is preferable to set the succeeding growth temperature lower than the preceding growth temperature. An InP layer is preferably grown at a relatively high temperature to a thickness of 1.5 µm and thereafter at a lower growth temperature. As described with the first embodiment, in order to prevent the InGaAsP layer exposed at the side walls of the mesa structure from being etched, the amount of additive halide may be reduced or the halide may not be added at the initial growth stage.

In the second to fourth embodiments, monochloroethane is added to source gas when an embedding layer is grown. Instead of monochloromethane, monochloroethane or other halide materials may be added.

In the first to fourth embodiments, InP is used as the material of a substrate and an embedding layer. Instead of InP, other compound semiconductor materials such as group III–V compound semiconductor may be used. An example of such group III–V compound semiconductor contains as its group III element at least one of In, Ga, and Al and at its group V element at least one of As and P.

In applying the first to fourth embodiments to an embedded mesa semiconductor laser, an Fe doped semi-insulating InP embedding layer is grown at the peripheral area of the mesa structure. Other layers such as a current block layer may be used to embed a mesa or stepped structure.

Figure 10A:
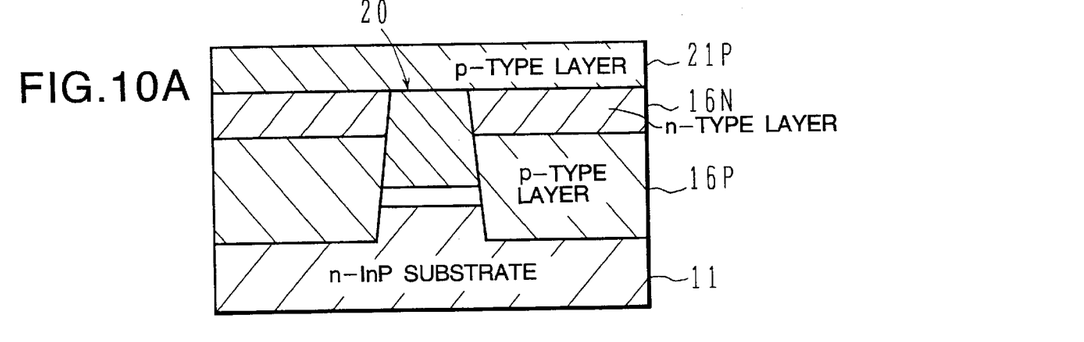
FIGS. 10A to 10D are cross sectional views of embedded mesa semiconductor lasers formed in accordance with the embodiments of the invention.
Figure 10B:
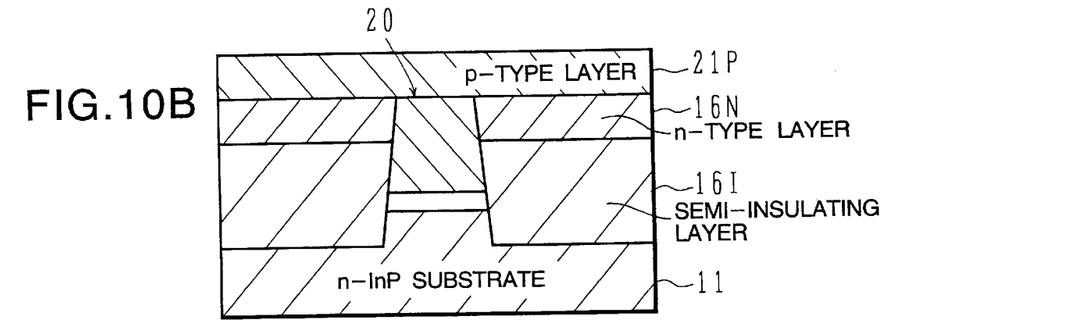

FIGS. 10A and 10B are cross sectional views of embedded mesa semiconductor lasers using an n-type InP substrate 11.

In FIG. 10A, an embedding layer is being formed of two layers, the lower layer being a p-type InP embedding layer 16P and the upper layer being an n-type InP embedding layer 16N. A p-type layer 21P is formed covering the upper surface of the n-type InP embedding layer 16N and the upper surface of a mesa structure 20. As a positive voltage is applied to the p-type layer 21P relative to an n-type InP substrate 11, a p-n junction between the n-type InP embedding layer 16N and the p-type InP embedding layer 16P is reverse-biased. Therefore, current flows concentrically through the mesa structure 20.

In FIG. 10B, a n embedding layer is formed of two layers, the lower layer being a semi-insulating InP embedding layer 16I and the upper layer being an n-type InP embedding layer 16N. As a positive voltage is applied to a p-type layer 21P relative to an n-type InP substrate 11, current is blocked by the semi-insulating embedding layer 16I so that current flows concentrically through the mesa structure 20.

Figure 10C:
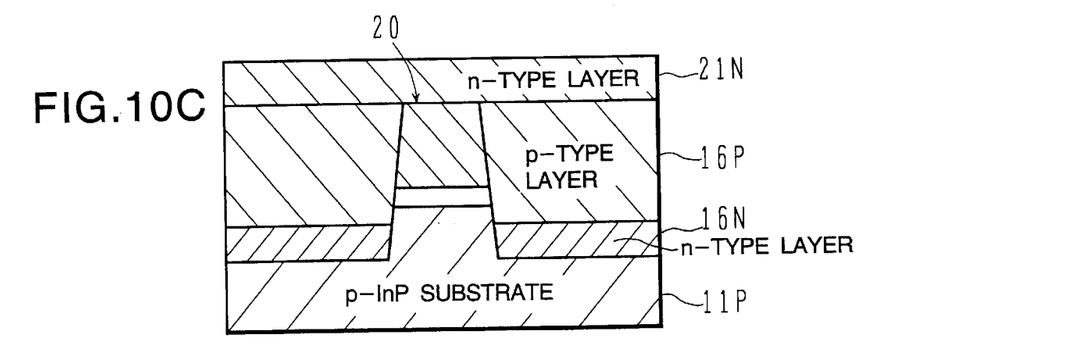
Figure 10D:
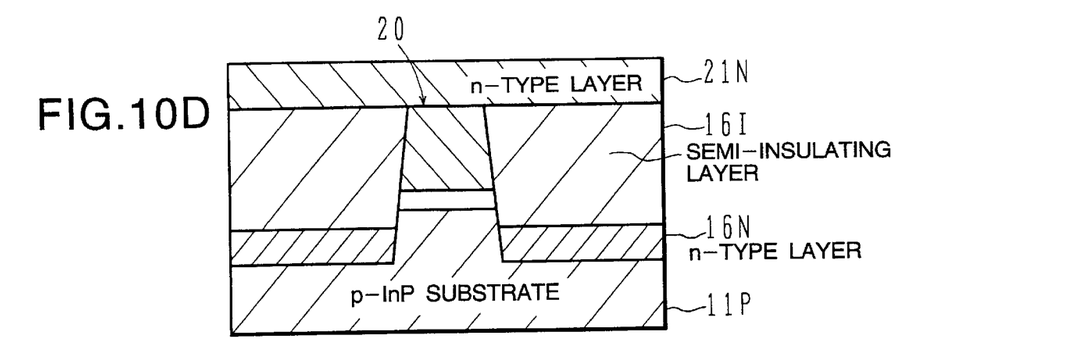

FIGS. 10C and 10D are cross sectional views of embedded mesa semiconductor lasers using a p-type InP substrate 11.

In FIG. 10C, an embedding layer is formed of two layers, the lower layer being an n-type InP embedding layer 16N and the upper layer being a p-type InP embedding layer 16P. An InP embedding layer 16P and the upper surface of a mesa structure 20. As a negative voltage is applied to the n-type layer 21N relative to a p-type InP substrate 11, a p-n junction between the p-type InP embedding layer 16P and the n-type InP embedding layer 16N is reverse-biased. Therefore, current flows concentrically through the mesa structure 20.

In FIG. 10D, an embedding layer is formed of two layers, the lower layer being an n-type InP embedding layer 16N and the upper layer being a semi-insulating InP embedding layer 16I. As a negative voltage is applied to an n-type layer 21N relative to a p-type InP substrate 11, current is blocked by the semi-insulating embedding layer 16I so that current flows concentrically through the mesa structure 20.

By providing a semi-insulating layer or a p-n junction to be reverse-biased, in the embedding layer, the embedding layer can function as a current blocking layer. Furthermore, since the embedding layer is suppressed from growing on and climbing the side walls of the mesa structure, the upper side of the embedding layer almost contacts the mesa structure. Therefore, the current confinement effect can be enhanced.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method of manufacturing a semiconductor device comprising the steps of:
   preparing a semiconductor substrate having a step on a surface thereof; and
   selectively growing a group III–V compound semiconductor layer on a stepped surface of the semiconductor substrate by metal organic vapor phase epitaxy using a source gas added with halogenated hydrocarbon which is monochloroethane ($C_2H_5Cl$) or monochloromethane ($CH_3Cl$), to embed the step while suppressing swelling of a growth surface near the step.

2. A method of manufacturing a semiconductor device according to claim 1, wherein said halogenated hydrocarbon is monochloroethane, said growing step grows the group III–V compound semiconductor layer at a growth temperature of 550 to 650° C., and a ratio of the number of halogen atoms to the number of group III element atoms in the source gas is 40 or smaller and larger than 0.01.

3. A method of manufacturing a semiconductor device according to claim 1, wherein said halogenated hydrocarbon is monochloroethane, said growing step grows the group III–V compound semiconductor layer at a growth temperature of 550 to 650° C., and a ratio of the number of halogen atoms to the number of group III element atoms in the source gas is 0.01 to 100.

4. A method of manufacturing a semiconductor device according to claim 1, wherein said halogenated hydrocarbon is monochloromethane, said growing step grows the group III–V compound semiconductor layer at a growth temperature of 550 to 650° C., and a ratio of the number of halogen atoms to the number of group III element atoms in the source gas is 0.01 to 200.

5. A method of manufacturing a semiconductor device according to claim 1, wherein the group III–V compound semiconductor layer includes as a group III element one of In, Ga, and Al and as a group V element one of As and P.

6. A method of manufacturing a semiconductor device according to claim 1, wherein the surface of the semiconductor substrate has a plane selected from a group consisting of a (100) plane, a (111)A plane, a (111)B plane, and a (011) plane.

7. A method of manufacturing a semiconductor device according to claim 1, wherein the surface of the semiconductor substrate prepared by said step of preparing a semiconductor substrate is formed with a mesa structure, an upper surface of the mesa structure being covered with an insulating layer, and said growing step is arranged not to substantially grow the group III–V compound semiconductor on the insulating film.

8. A method of manufacturing a semiconductor device according to claim 7, wherein said growing step stops growth when an upper surface of the group III–V compound semiconductor layer becomes generally flush with the upper surface of the mesa structure.

9. A method of manufacturing a semiconductor device according to claim 8, wherein said mesa structure includes a laser diode structure formed with a compound semiconductor clad layer of a first conductivity type, a compound semiconductor active layer, and a compound semiconductor clad layer of a second conductivity type opposite to the first conductivity type, respectively formed in this order.

10. A method of manufacturing a semiconductor device according to claim 9, wherein said growing step includes the steps of:
    forming a group III–V compound semiconductor embedding layer of the second conductivity type, and
    forming a group III–V compound semiconductor embedding layer of the first conductivity type on the group III–V compound semiconductor embedding layer of the second conductivity type.

11. A method of manufacturing a semiconductor device according to claim 9, wherein said growing step includes the step of forming a semi-insulating group III–V compound semiconductor embedding layer having a higher resistance than the group III–V compound semiconductor clad layers of the first and second conductivity types.

12. A method of manufacturing a semiconductor device comprising the steps of:
    preparing a substrate having a compound semiconductor surface of a (100) plane;
    forming a mesa structure on a surface of the substrate, a side wall of the mesa structure having a plane tilted from a (011) plane toward a <111>A direction; and
    forming a compound semiconductor embedding layer covering an area of the surface of the substrate where the mesa structure is not formed and the side wall of the mesa structure, through metal organic vapor phase epitaxy by using source gas added with halide.

13. A method of manufacturing a semiconductor device according to claim 12, wherein said step of forming a mesa structure includes the steps of:

forming a mask pattern on the surface of the substrate where the mesa structure is to be formed;

etching the surface of the substrate through dry etching by using the mask pattern as a mask and leaving a mesa plateau; and wet etching a partial area of a side wall of the mesa plateau to expose a plane tilted from a (011) plane toward a <111>A direction.

14. A method of manufacturing a semiconductor device according to claim 12, wherein said step of preparing a substrate includes the steps of:

preparing a lower support substrate having a compound semiconductor surface of a (100) plane; and forming on the surface of the lower support substrate a laser diode structure having a compound semiconductor clad layer of a first conductivity type, a compound semiconductor active layer, and a compound semiconductor clad layer of a second conductivity type opposite to the first conductivity type, respectively formed in this order, and said step of forming a mesa structure etches the upper surface of the substrate at a peripheral area around an area where the mesa structure is to be formed, to a level deeper than an interface between the active layer and the compound semiconductor clad layer of the first conductivity type.

15. A method of manufacturing a semiconductor device according to claim 14, wherein said step of forming the compound semiconductor embedding layer includes the steps of:

forming an embedding layer of the second conductivity type; and forming an embedding layer of the first conductivity type on the embedding layer of the second conductivity type.

16. A method of manufacturing a semiconductor device according to claim 14, wherein said step of forming a compound semiconductor embedding layer includes the step of forming a semi-insulating embedding layer having a higher resistance than the compound semiconductor clad layers of the first and second conductivity types.

17. A method of manufacturing a semiconductor device according to claim 12, wherein said halide is monochloromethane or monochloroethane.

18. A method of manufacturing a semiconducting device comprising the steps of:

preparing a substrate having a compound semiconductor surface;

forming a mesa structure on the surface of the substrate;

forming a first compound semiconductor embedding layer covering an area of the surface of the substrate where the mesa structure is not formed and a side wall of the mesa structure, through first metal organic vapor phase epitaxy; and forming a second compound semiconductor embedding layer, which consists essentially of a same material as that of the first compound semiconductor embedding layer on a surface of the first compound semiconductor embedding layer, through second metal organic vapor phase epitaxy under different conditions than the first metal organic vapor phase epitaxy by using source gas added with halide.

19. A method of manufacturing a semiconductor device according to claim 18, wherein said step of forming a first compound semiconductor embedding layer forms the first compound semiconductor embedding layer, with addition of an amount of the halide to the source gas less than that used by said step of forming a second compound semiconductor embedding layer.

20. A method of manufacturing a semiconductor device according to claim 19, wherein a growth temperature at said step of forming a second compound semiconductor embedding layer is lower than that at said step of forming a first compound semiconductor embedding layer.

21. A method of manufacturing a semiconductor device according to claim 18, wherein said step of preparing a substrate includes the steps of:

preparing a lower support substrate having a compound semiconductor surface of a (100) plane; and forming on the surface of the lower support substrate a laser diode structure having a compound semiconductor clad layer of a first conductivity type, a compound semiconductor active layer, and a compound semiconductor clad layer of a second conductivity type opposite to the first conductivity type, respectively formed in this order, and said step of forming a mesa structure etches the upper surface of the substrate at a peripheral area around an area where the mesa structure is to be formed, to a level deeper than an interface between the active layer and the compound semiconductor clad layer of the first conductivity type.

22. A method of manufacturing a semiconductor device according to claim 21, wherein said stop of forming the compound semiconductor embedding layer includes the steps of:

forming an embedding layer of the second conductivity type; and forming an embedding layer of the first conductivity type on the embedding layer of the second conductivity type.

23. A method of manufacturing a semiconductor device according to claim 21, wherein said step of forming a compound semiconductor embedding layer includes the step of forming a semi-insulating embedding layer having a higher resistance than the compound semiconductor clad layers of the first and second conductivity types.

24. A method of manufacturing a semiconductor device according to claim 18, wherein said halide is monochloromethane or monochloroethane.

* * * * *